(12) United States Patent
Hajase et al.

(10) Patent No.: US 9,253,874 B2
(45) Date of Patent: Feb. 2, 2016

(54) PRINTED CIRCUIT BOARD HAVING DC BLOCKING DIELECTRIC WAVEGUIDE VIAS

(71) Applicant: INTERNATIONAL BUSINESS MACHINES CORPORATION, Armonk, NY (US)

(72) Inventors: Jose A. Hajase, Austin, TX (US); Nanju Na, Essex Junction, VT (US); Nam H. Pham, Round Rock, TX (US); Lloyd Walls, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 223 days.

(21) Appl. No.: 13/647,819

(22) Filed: Oct. 9, 2012

(65) Prior Publication Data

US 2014/0097918 A1    Apr. 10, 2014

(51) Int. Cl.
| | |
|---|---|
| *H01P 3/08* | (2006.01) |
| *H05K 3/42* | (2006.01) |
| *H05K 1/02* | (2006.01) |
| *H01P 1/04* | (2006.01) |
| *H01P 5/02* | (2006.01) |
| *H05K 1/11* | (2006.01) |

(52) U.S. Cl.
CPC ............... *H05K 1/024* (2013.01); *H01P 1/047* (2013.01); *H01P 5/028* (2013.01); *H05K 1/115* (2013.01); *H05K 2201/0187* (2013.01); *Y10T 29/49165* (2015.01)

(58) Field of Classification Search
CPC ....... H01P 3/121; H01P 1/047; H01P 11/003; H01P 5/028; H05K 1/024; H05K 1/115; Y10T 29/49165
USPC .......................................................... 333/246
See application file for complete search history.

(56) References Cited

U.S. PATENT DOCUMENTS

| 5,258,730 A * | 11/1993 | Stern et al. ................. 333/246 |
| 5,770,981 A | 6/1998 | Koizumi et al. |
| 6,909,345 B1 * | 6/2005 | Salmela et al. ............. 333/239 |
| 6,977,560 B2 | 12/2005 | Itoh et al. |
| 7,132,905 B2 | 11/2006 | Sano |
| 2012/0206213 A1 | 8/2012 | Kojima et al. |

* cited by examiner

*Primary Examiner* — Stephen E Jones
*Assistant Examiner* — Scott S Outten
(74) *Attorney, Agent, or Firm* — Russell Ng PLLC; Steven Bennett

(57) ABSTRACT

A printed circuit board is disclosed. The printed circuit board includes a first signal transmission layer, a via and a second signal transmission layer. The via connects the first signal transmission layer to the second signal transmission layer. The via includes a first region made of a first dielectric material having a first dielectric constant, and a second region made of a second dielectric material having a second dielectric constant lower than the first dielectric constant. The via allows AC Component of an electromagnetic signal to be transmitted from the first signal transmission layer to the second signal transmission layer while blocking any DC component of the electromagnetic signal.

10 Claims, 5 Drawing Sheets

PRINTED CIRCUIT BOARD HAVING DC BLOCKING DIELECTRIC WAVEGUIDE VIAS

BACKGROUND OF THE INVENTION

1. Technical Field

The present invention relates to printed circuit boards in general, and, in particular, to a printed circuit board having dielectric waveguide vias capable of transferring the AC component while blocking the DC component of electrical signals.

2. Description of Related Art

Different types of electronic devices can be mounted on one or both surfaces of a multi-layer printed circuit board (PCB). Transmission lines are typically utilized to route electrical signals among electronic devices. Transmission lines located on various layers of a PCB are interconnected with each other by means of a number of vertical connectors commonly known as vias.

Vias are typically filled with metal, but metallic vias are subject to many side effects that can degrade signal quality. For example, transitions to and from vias may cause an impedance discontinuity that can degrade signal quality. In addition, metallic vias may have stubs that can distort signal waveforms. The above-mentioned side effects become more pronounced when signal frequencies are increased.

In addition, metallic vias can generate a DC connection between a trace in one layer of a PCB and a trace in another layer of the PCB. DC-blocking capacitors can be utilized to prevent DC connections; however, the addition of DC-blocking capacitors on the PCB may require more vias and extra board space in case of inner layer traces, which may lead to even more opportunities for signal discontinuity and loss. Capacitor parasitics from DC-blocking capacitors also cause signal degradation when signal frequencies are increased.

Consequently it would be desirable to provide an improved PCB that is free from the above-mentioned shortcomings.

SUMMARY OF THE INVENTION

In accordance with a preferred embodiment of the present invention, a printed circuit board includes a first signal transmission layer, a second signal transmission layer and a via. The via connects the first signal transmission layer to the second signal transmission layer. The via includes a first region made of a first dielectric material having a first dielectric constant, and a second region made of a second dielectric material having a second dielectric constant lower than the first dielectric constant. The via allows AC component of an electromagnetic signal to be transmitted from the first signal transmission layer to the second signal transmission layer while blocking any DC component of the electromagnetic signal.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
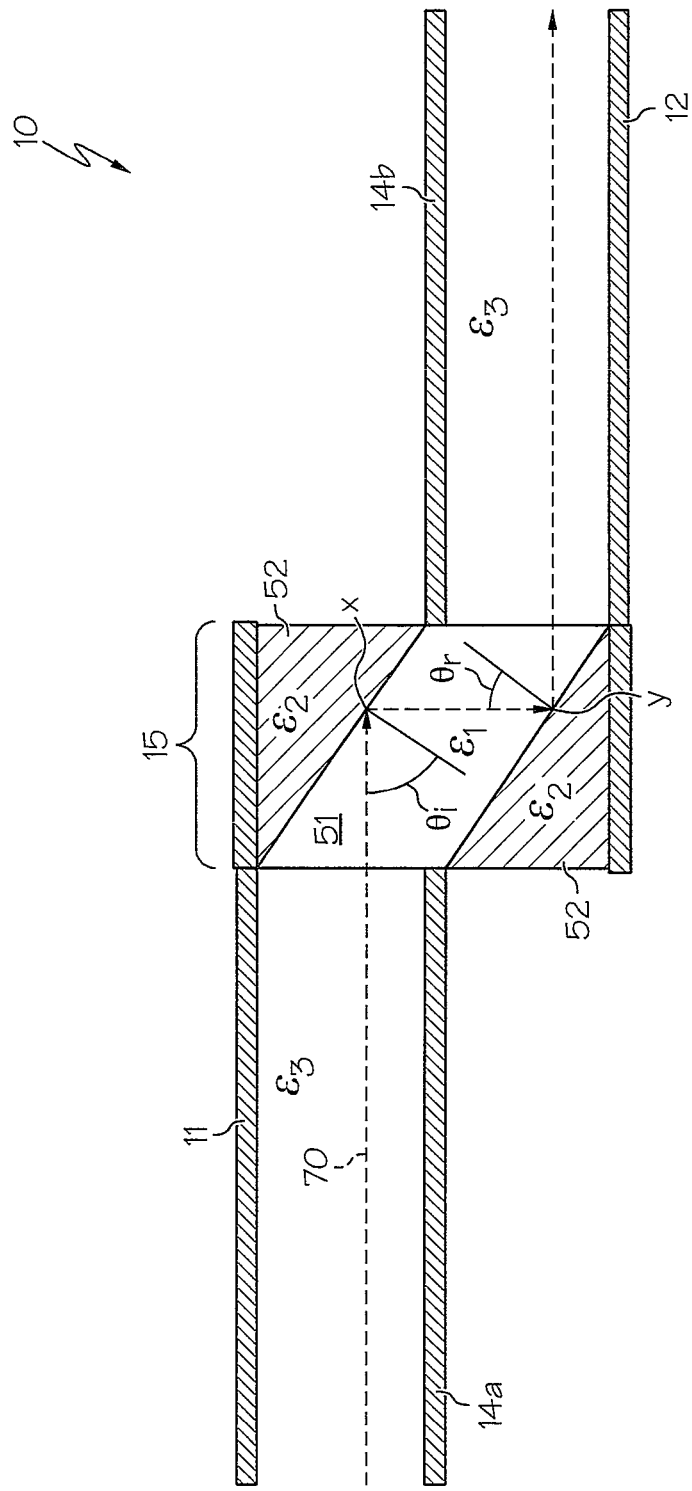
FIGS. 1a-1b are diagrams of a printed circuit board having a dielectric waveguide via, in accordance with a preferred embodiment of the present invention.

Referring now to the drawings and in particular to FIG. 1a, there is illustrated a diagram of a printed circuit board (PCB) having a dielectric waveguide via, in accordance with a preferred embodiment of the present invention. As shown, a PCB 10 includes a first microstrip 11, a second microstrip 12 and a dielectric waveguide via 15. PCB 10 also includes ground planes 14a, 14b. First microstrip 11 and ground plane 14a are connected to second microstrip 12 and ground plane 14b by dielectric waveguide via 15.

Microstrips 11, 12 and ground planes 14a, 14b are preferably made of copper layers. The area of PCB 10 that is located between microstrip 11 and ground plane 14a is made of dielectric material having a dielectric constant $\in_3$. Similarly, the area of PCB 10 that is located between ground plane 14b and microstrip 12 is made of dielectric material having a dielectric constant $\in_3$.

Figure 1B:
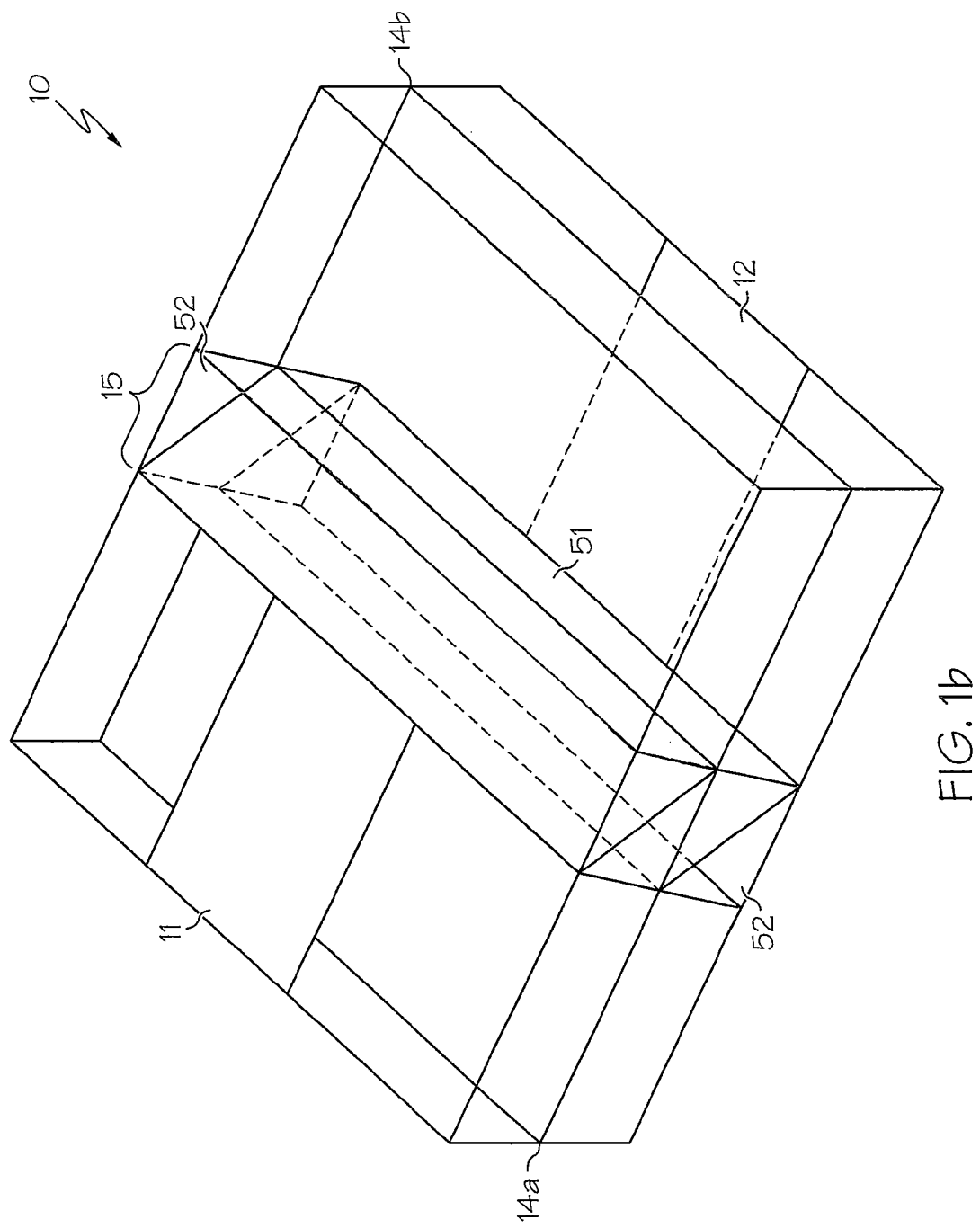

An isometric view of PCB 10 is depicted in FIG. 1b. Since microstrip 11 is not connected to microstrip 12, and ground plane 14a is not connected to ground plane 14b, there is no longer a conductor path for any DC signal content within electromagnetic signals passing from microstrip 11 to microstrip 12. Thus, dielectric waveguide via 15 allows PCB 10 to have DC-blocking capabilities, and DC-blocking capacitors are no longer needed for PCB 10, which save parts costs and board space.

Dielectric waveguide via 15 includes a first region 51 having a dielectric constant $\in_1$, and a second region 52 having a dielectric constant $\in_2$, where $\in_1 > \in_2$. First region 51 is oriented in an angle (i.e., slanted) in relation to the "sidewalls" of dielectric waveguide via 15 to allow electromagnetic signals to be reflected within the interfaces between first region 51 and second region 52.

For example, a high-frequency electromagnetic signal 70 traveling through the dielectric material of PCB 10 located between first microstrip 11 and ground plane 14a can be bound within, first region 51 of dielectric waveguide via 15, and then to the dielectric material of PCB 10 located between ground plane 14b and second microstrip 12.

Specifically, electromagnetic signal 70 enters dielectric waveguide via 15 and reflects at a point x of a first interface between first and second regions 51, 52 of dielectric waveguide via 22 at an angle of incidence of $\theta_r$. Electromagnetic signal 70 then reflects at a point y of a second interface between first and second regions 51, 52 of dielectric waveguide via 15 at an angle of reflection of $\theta_r$.

In order to achieve minimal loss of electromagnetic signal 70, it is important to provide complete internal reflections of electromagnetic signal 70 within first region 51 of dielectric waveguide via 15. This will occur when the angle of incidence $\theta_i$ of electromagnetic signal 70 is greater than a critical angle $\theta_c$ that can be determined by:

$$\theta_c = \arcsin(\sqrt{\in_2/\in_1})$$

For optimum signal propagation of electromagnetic signal 70 through dielectric waveguide via 15, the wavefront of electromagnetic signal 70 should be reflected off the two internal interfaces of dielectric waveguide via 15 an equal number of times. In order to minimize the propagation distance as well as the loss of electromagnetic signal 70, there should only be one reflection off each interface within first region 51 of dielectric waveguide via 15. An angle of 45° is the preferred choice for angle of incidence $\theta_i$ as long as it is also greater than the critical angle $\theta_c$.

Several factors must be considered in choosing the dielectric materials for first and second regions 51, 52 of dielectric waveguide via 15. One factor is that the optimal angle of incidence $\theta_i$ of 45° must be larger than the critical angle $\theta_c$ as determined by the dielectric constants in the equation above.

Another factor affecting the choice of me dielectric constant $\in_1$ of region 51 of dielectric waveguide via 15 involves the relationship between the wavelength of electromagnetic signal 70 being transmitted and the vertical thickness of first region 51 of dielectric waveguide via 15. The vertical thickness of first region 51 of dielectric waveguide via 15 is defined as the geometric distance between points x and y in FIG. 1a when the angle of incidence $\theta_i$ is 45°. First region 51 of dielectric waveguide via 15 must act as a pair of reflectors to move electromagnetic signal 70 from one board layer to another. Maximum possible signal transmission is achieved when the vertical thickness of first region 51 of dielectric waveguide via 15 is at least equal to one signal wavelength. For lower signal frequencies, at which the vertical thickness of first region 51 of dielectric waveguide via 15 is less than one wavelength, wave scattering occurs, causing transmission losses. Thus, given a feed vertical thickness for first region 51 of dielectric waveguide via 15, the usage of a higher dielectric constant will decrease that wavelength, which extends the low end of electromagnetic signal frequency range dielectric waveguide via 15 can support. Alternatively, first region 51 of dielectric waveguide via 15 (and PCB 10 in which it is embedded) can be made thicker at an additional cost for the extra material and space required.

Yet another factor affecting the choice of dielectric constant $\in_1$ of region 51 of dielectric waveguide via 15 involves impedance matching. Due to the fact that the signal transmission magnitude through the channel increases from virtually zero at DC to a frequency above which it saturates in an area of high transmission, it can be deduced that the impedance of dielectric via waveguide 15 decreases from a high impedance at DC to an almost constant lower impedance. Thus, given a certain characteristic impedance for the preceding and proceeding transmission lines, the dielectric constant of $\in_1$ of region 51 of dielectric waveguide via 15 can be picked to adjust the impedance of dielectric waveguide via 15 in order to achieve impedance matching. Alternatively, given the dielectric constant $\in_1$ of region 51 of dielectric waveguide via 15 and thus a particular via impedance, the transmission line characteristic impedances can be picked towards the same purpose accordingly. Signal transmission is most effective when there is impedance matching between dielectric waveguide via 15 and the transmission lines (such as microstrips 11 and 12) to which it connects. Either the impedance of dielectric waveguide via 15 must be adjusted to that of the transmission lines, or that of the transmission lines must be adjusted to that of dielectric waveguide via 15.

Figure 2A:
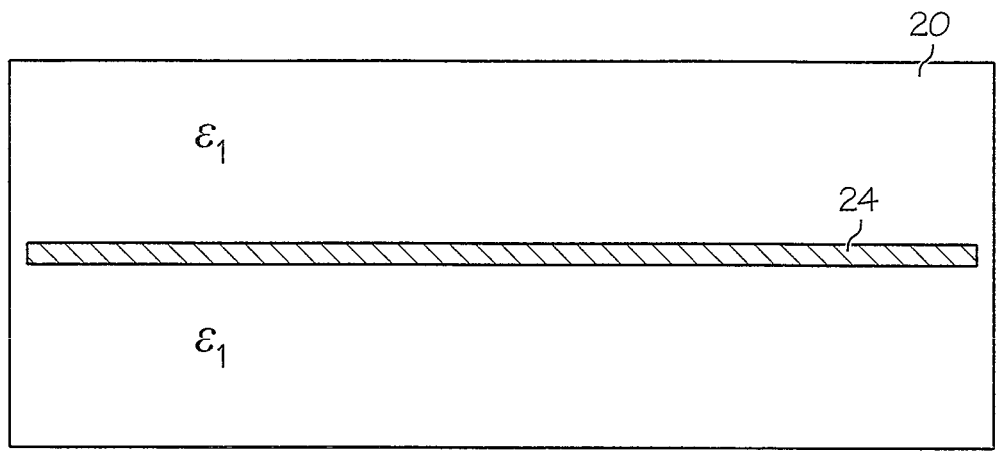
FIGS. 2a-2f illustrate a method for constructing the dielectric waveguide from FIG. 1a, in accordance with a preferred embodiment of the present invention.
Figure 2B:
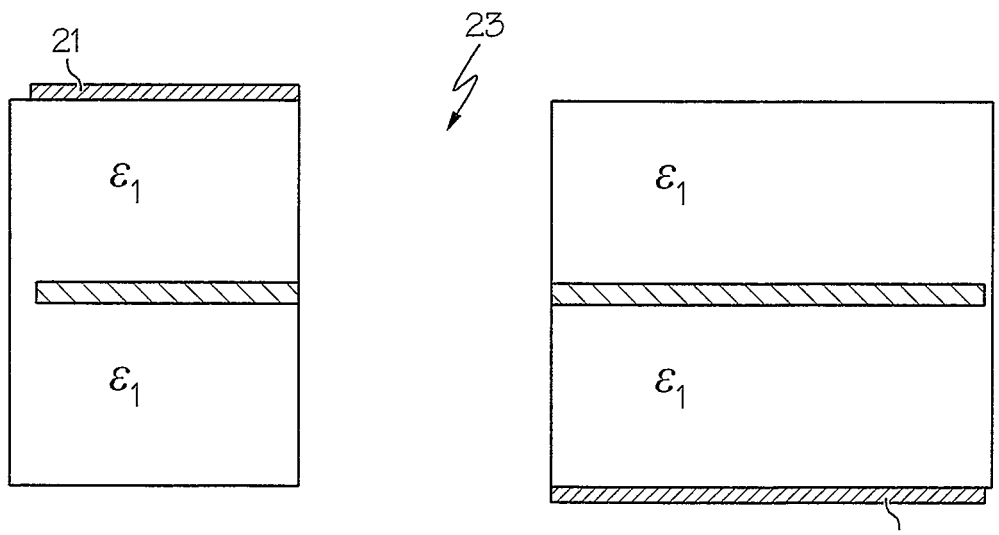
Figure 2C:
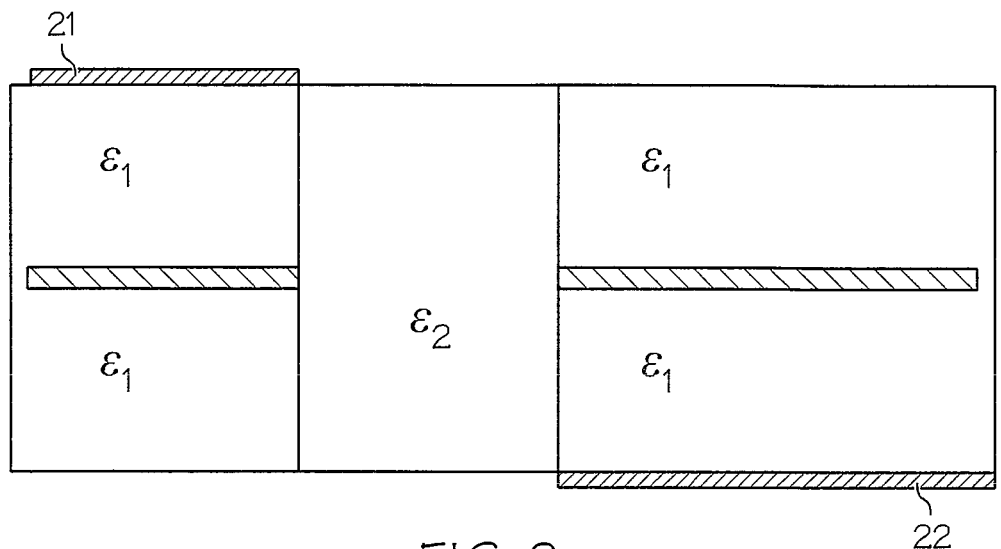

With reference now to FIGS. 2a-2f, there are illustrated a method for constructing a dielectric waveguide via, such as dielectric waveguide via 15 from FIG. 1, in accordance with a preferred embodiment of the present invention. In the present embodiment, the dielectric constant of the dielectric materials in one of the regions within the dielectric waveguide via is shown to be the same as the dielectric material of the PCB. The process begins with a PCB 20 formed by two layers of dielectric material each having a relatively high dielectric constant $\in_3$, separated by a layer of ground plane 24, as shown in FIG. 2a. After metal microstrips 21, 22 have been placed on each side of PCB 20, a vertical opening 23 is drilled at the point at which an electromagnetic signal must be transmitted from microstrip 21 to microstrip 22, as depicted in FIG. 2b. In order to provide a flat via interface, drilled vertical opening 23 is followed by a rectangular punch. Vertical opening 23 is then filled with a dielectric material having a relatively low dielectric constant $\in_2$, where $\in_2 < \in_3$, as shown in FIG. 2c.

Figure 2D:
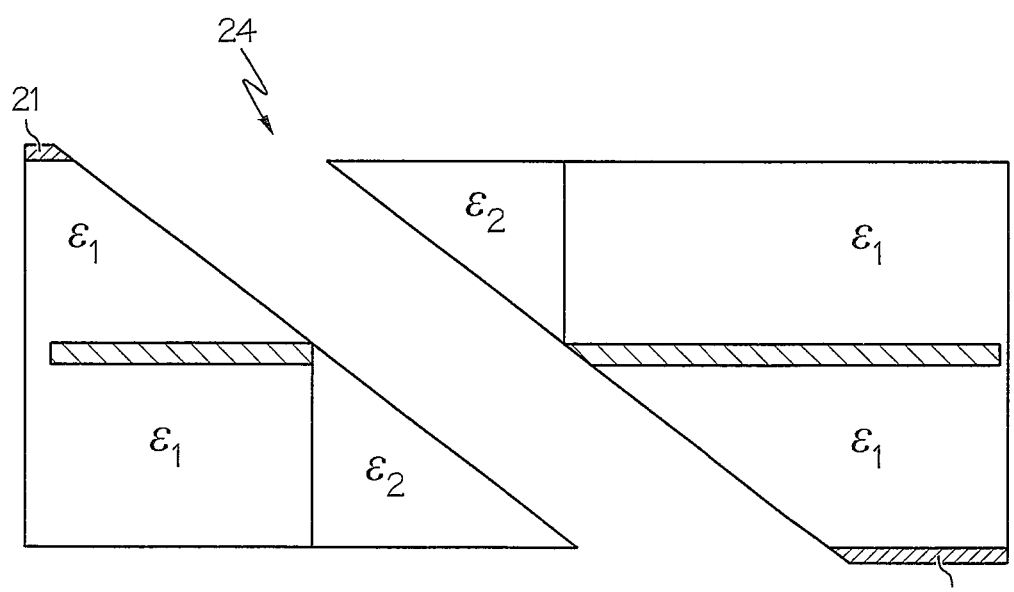
Figure 2E:
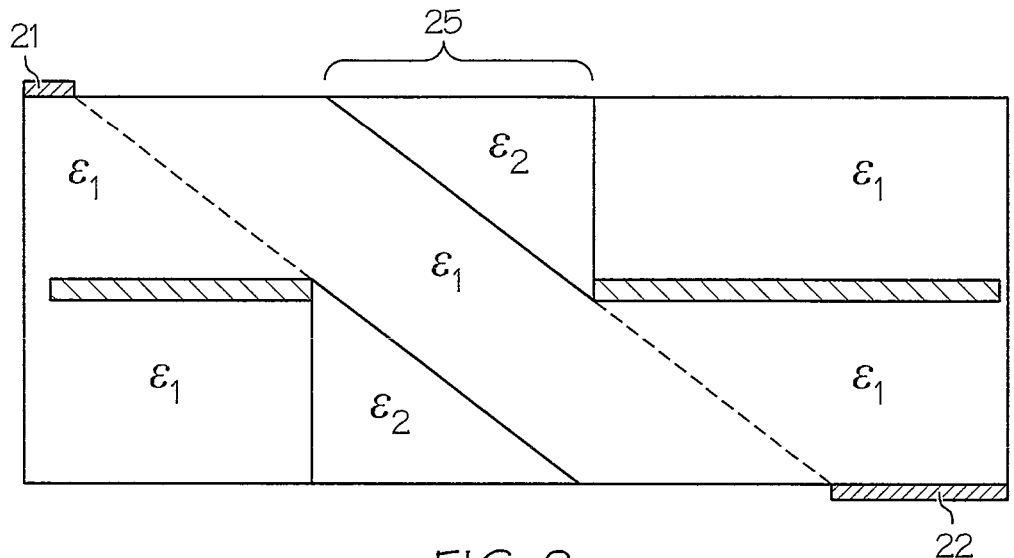
Figure 2F:
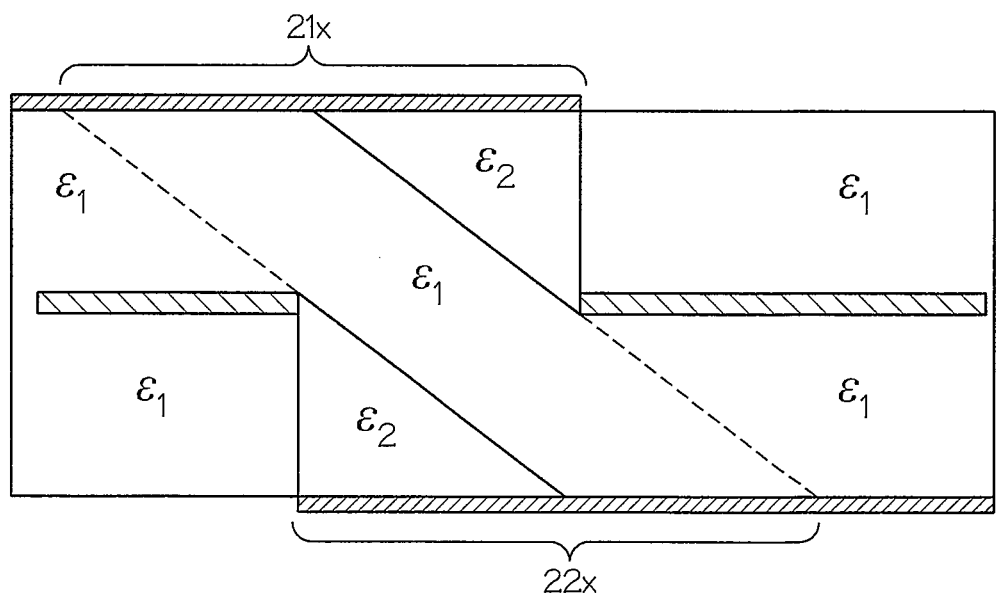

Next, a slanted opening 24 is drilled at an angle transversely to vertical opening 23 (now filled with dielectric material), as depicted in FIG. 2d. In order to provide flat reflection surfaces within a via, drilled slanted opening 24 is followed by a rectangular punch. Slanted opening 24 is subsequently filled with a dielectric material having a dielectric constant $\in_3$ (i.e., same dielectric material as PCB 20), as shown in FIG. 2e. Additionally, in order to improve performance, the width of openings 23, 24 and the width of metal microstrips 21, 22 can be widened. Although slanted opening 24 is shown to be filled with a dielectric material having the same dielectric constant as the dielectric material within PCB 20, it is understood by those skilled in the art that slanted opening 23 can be filled a dielectric material having a different dielectric constant $\in_1$ as along as $\in_1 > \in_2$.

At this point, a dielectric waveguide via 25 is formed. Dielectric waveguide via 25 includes a first region of dielectric material having a relatively high dielectric constant $\in_3$ and a second region of dielectric material having a relatively low dielectric constant $\in_2$. The boundaries of dielectric waveguide via 25 can be defined as the boundaries of vertical opening 23 from FIG. 2b. Finally, a set of extension microstrips 21x and 22x are utilized to cover the two types of opening-filling dielectric materials.

Extension microstrips 21x and 22x generate additional capacitance that can improve coupling between microstrips 21 and 22. Extension microstrips 21x and 22x also add a physical bound to any leaking electromagnetic signals. The physical bounds and improved coupling result in better impedance matching between microstrips 21 and 22 connected by dielectric waveguide via 25, which in turn results in improved signal transmissions. Extension microstrips 21x and 22x are particularly useful at signal frequencies at which the vertical thickness of dielectric waveguide via 25 is less than one wavelength resulting in wave scattering and leakage. Extension microstrips 21x and 22x have almost no effect on transmission loss above the signal frequency at which the vertical thickness of dielectric waveguide via 25 is one wavelength, since now dielectric waveguide via 25 is appropriately sized for efficient reflection, which makes wave scattering and leakage negligible, thereby increasing transmission loss at the lower frequency transition band.

As has been described, the present invention provides an improved PCB having a dielectric waveguide via optimized to transfer high-frequency electromagnetic signals.

While the invention has been particularly shown and described with reference to a preferred embodiment, it will be understood by those skilled in the art that various changes in form and detail may be made therein without departing from the spirit and scope of the invention.

What is claimed is:

1. A printed circuit board comprising:
   a first signal transmission layer having a first microstrip including a first ground plane;
   a second signal transmission layers having a second microstrip including a second ground plane; and
   a via includes a first region having a triangular cross-section, a second region having a triangular cross-section, and a channel connecting said first signal transmission layer to said second signal transmission layer, wherein said first region opposes said second region, wherein said channel is made of a first dielectric material having a first dielectric constant, and said first and second regions are made of a second dielectric material having a second dielectric constant lower than said first dielectric constant, wherein said via allows an AC component of an electromagnetic signal to be transmitted from said first signal transmission layer to said second signal transmission layer while blocking any DC component of said electromagnetic signal.

2. The printed circuit board of claim 1, wherein said first signal transmission layer further includes a PCB dielectric layer located between said first microstrip and said first ground plane.

3. The printed circuit board of claim 2, wherein said second signal transmission layer further includes a PCB dielectric layer located between said second microstrip and said second ground plane.

4. The printed circuit board of claim 3, wherein said PCB dielectric layer has said first dielectric constant.

5. The printed circuit board of claim 3, wherein said PCB dielectric layer has a third dielectric constant.

6. The printed circuit board of claim 2, wherein said PCB dielectric layer has said first dielectric constant.

7. The printed circuit board of claim 2, wherein said PCB dielectric layer has a third dielectric constant.

8. The printed circuit board of claim 1, wherein said first signal transmission layer is made of a dielectric material having a third dielectric constant.

9. The printed circuit board of claim 8, wherein said second signal transmission layer is made of a dielectric material having a third dielectric constant.

10. The printed circuit board of claim 1, wherein an angle of incidence $\theta_i$ of said electromagnetic signal in said channel is greater than a critical angle $\theta_c$ determined by $$\theta_c = \arcsin[\mathrm{sqrt}(\in_2/\in_1)]$$

wherein $\in_1$ is said first dielectric constant and $\in_2$ is said second dielectric constant.

* * * * *

UNITED STATES PATENT AND TRADEMARK OFFICE
CERTIFICATE OF CORRECTION

| | | |
|---|---|---|
| PATENT NO. | : 9,253,874 B2 | Page 1 of 1 |
| APPLICATION NO. | : 13/647819 | |
| DATED | : March 18, 2003 | |
| INVENTOR(S) | : Jose A. Hejase et al. | |

It is certified that error appears in the above-identified patent and that said Letters Patent is hereby corrected as shown below:

ON THE TITLE PAGE

In (12), please replace "Hajase et al." with --Hejase et al.--

In (72), please replace "Jose A. Hajase" with --Jose A. Hejase--

Signed and Sealed this
Third Day of May, 2016

Michelle K. Lee
*Director of the United States Patent and Trademark Office*